United States Patent
Sudo

(10) Patent No.: US 10,418,113 B2
(45) Date of Patent: Sep. 17, 2019

(54) OPERATION METHOD FOR SUPPRESSING FLOATING GATE (FG) COUPLING

(71) Applicant: Winbond Electronics Corp., Taichung (TW)

(72) Inventor: Naoaki Sudo, Kanagawa (JP)

(73) Assignee: Windbond Electronics Corp., Taichung (TW)

( * ) Notice: Subject to any disclaimer, the term of this patent is extended or adjusted under 35 U.S.C. 154(b) by 0 days.

(21) Appl. No.: 16/361,258

(22) Filed: Mar. 22, 2019

(65) Prior Publication Data

US 2019/0221271 A1    Jul. 18, 2019

Related U.S. Application Data

(62) Division of application No. 15/350,125, filed on Nov. 14, 2016, now Pat. No. 10,290,357.

(30) Foreign Application Priority Data

Jan. 18, 2016    (JP) .................. 2016-007261

(51) Int. Cl.
| | | |
|---|---|---|
| *G11C 16/26* | (2006.01) | |
| *G11C 7/10* | (2006.01) | |
| *G11C 16/10* | (2006.01) | |
| *G11C 16/34* | (2006.01) | |
| *G11C 16/04* | (2006.01) | |
| *G11C 7/02* | (2006.01) | |
| *G11C 7/18* | (2006.01) | |

(52) U.S. Cl.
CPC ............... *G11C 16/26* (2013.01); *G11C 7/02* (2013.01); *G11C 7/106* (2013.01); *G11C 7/1087* (2013.01); *G11C 7/18* (2013.01); *G11C 16/0483* (2013.01); *G11C 16/10* (2013.01); *G11C 16/3427* (2013.01); *G11C 2207/002* (2013.01); *G11C 2207/005* (2013.01)

(58) Field of Classification Search
CPC .. G11C 16/26; G11C 7/18; G11C 7/02; G11C 7/106; G11C 16/3427; G11C 16/10; G11C 7/1087; G11C 16/0483; G11C 2207/002; G11C 2207/005
See application file for complete search history.

(56) References Cited

U.S. PATENT DOCUMENTS

2008/0094901 A1*   4/2008   Park ................... G11C 16/3418
                                                 365/185.12
2013/0279251 A1*  10/2013   Lee ....................... G11C 16/26
                                                 365/185.03

* cited by examiner

*Primary Examiner* — Jerome Leboeuf
(74) *Attorney, Agent, or Firm* — JCIPRNET

(57) ABSTRACT

A NAND flash memory suppresses an influence caused by FG coupling and has high reliability. The flash memory of the invention includes: a memory array formed with a plurality of NAND strings; a row selection unit selecting rows of the memory array; and a bit line selection circuit (200) selecting even-numbered pages or odd-numbered pages of the selected row. The even-numbered pages (BL0, BL1, BL4, BL5) include a plurality of pairs of adjacent bit line pairs, the odd-numbered pages (BL2, BL3, BL6, BL7) include a plurality of pairs of adjacent bit line pairs, and the bit lines of the even-numbered page and the bit lines of the odd-numbered page are arranged alternately.

8 Claims, 11 Drawing Sheets

OPERATION METHOD FOR SUPPRESSING FLOATING GATE (FG) COUPLING

CROSS-REFERENCE TO RELATED APPLICATION

This application is a divisional application of and claims the priority benefit of U.S. application Ser. No. 15/350,125, filed on Nov. 14, 2016, now allowed, which claims the priority benefit of Japan application serial no. 2016-007261, filed on Jan. 18, 2016. The entirety of the above-mentioned patent application is hereby incorporated by reference herein and made a part of this specification.

BACKGROUND OF THE INVENTION

Field of the Invention

The invention relates to a semiconductor memory device and particularly relates to a method of selecting an even-numbered page or an odd-numbered page of a NAND flash memory.

Description of Related Art

In a NAND flash memory, when the pages are read or programmed, one word line is divided into an even-numbered page and an odd-numbered page to be operated in order to suppress noise generated by the capacity coupling between the bit lines. For example, when the even-numbered page is read, the odd-numbered page is grounded; and when the odd-numbered page is read, the even-numbered page is grounded. Moreover, when the even-numbered page is programmed, the odd-numbered page is set to be disabled from programming; and when the odd-numbered page is programmed, the even-numbered page is set to be disabled from programming (Patent Literature 1, for example).

PRIOR ART LITERATURE

Patent Literature

Patent Literature 1: Japanese Patent Publication No. H11-176177

Problem to Be Solved

FIG. 1 is a diagram illustrating a bit line selection method for the conventional NAND flash memory. NAND strings of the memory array are respectively connected with a page buffer/reading circuit via bit lines BL0, BL1, ... BL7 (eight bit lines are depicted as an example). Here, the bit lines BL0, BL2, BL4, and BL6 are even-numbered bit lines, and the selection memory cells connected with the even-numbered bit lines constitute the even-numbered page. The bit lines BL1, BL3, BL5, and BL7 are odd-numbered bit lines, and the selection memory cells connected with the odd-numbered bit lines constitute the odd-numbered page. In other words, one word line of the memory array includes two pages, i.e. the even-numbered page and the odd-numbered page.

A bit line selection circuit includes a plurality of selection transistors for selecting the even-numbered page or the odd-numbered page between each of the bit lines BL0, BL1, ... BL7 and a latch circuit or a reading circuit SA, and a selection gate line BLSE and a selection gate line BLSO are alternately connected with the gates of multiple selection transistors. When the even-numbered page is selected, the selection gate line BLSE is driven to a high level while the selection gate line BLSO is driven to a low level; and when the odd-numbered page is selected, the selection gate line BLSO is driven to a high level while the selection gate line BLSE is driven to a low level. Moreover, in order to cut off the bit lines according to the operation state, selection gate lines BLCN, /BLCN, BLCLAMP, and /BLCLAMP are connected with the gates of the transistors respectively. Thereby, reading or programming is performed with the even-numbered page or the odd-numbered page as a unit. Additionally, in the reading operation, the so-called "shield reading" is carried out. That is, when the even-numbered page is read, the odd-numbered page is grounded; and when the odd-numbered page is read, the even-numbered page is grounded.

By performing reading or programming on the even-numbered page and the odd-numbered page separately, influence of the capacity coupling between the bit lines is reduced. However, as memory cells become more highly integrated, the floating gate (FG) coupling between the memory cells becomes significant as well. For example, as shown in FIG. 2(A), data "0" is programmed to memory cells Ma and Mb of the even-numbered page of the selected word line WLi, and then as shown in FIG. 2(B), data "0" is programmed to memory cells Mx and My of the odd-numbered page. The memory cells are in an erasing state before being programmed.

When the even-numbered page is programmed, a programming pulse is applied to the memory cells Ma and Mb, and when the memory cells Ma and Mb are determined as eligible through programming verification, application of the programming pulse ends. At this time, a threshold value of the memory cell Ma is Vth_a and a threshold value of the memory cell Mb is Vth_b. The threshold value of the memory cell Mx of the odd-numbered page slightly rises due to the FG coupling with two memory cells Ma and Mb and the threshold value of the memory cell My slightly rises due to the FG coupling with one memory cell Mb.

Then, when the odd-numbered page is programmed, the programming pulse is applied to the memory cells Mx and My, and when the memory cells Mx and My are determined as eligible through programming verification, application of the programming pulse ends. At this time, the threshold value Vth_a of the memory cell Ma rises to Vth_a+ΔV due to the FG coupling with the memory cell Mx (ΔV is set to a voltage that rises due to the FG coupling with one memory cell). Further, the threshold value Vth_b of the memory cell Mb rises to Vth_b+2ΔV due to the FG coupling with the memory cells Mx and My. Thus, the threshold values of the memory cells Ma and Mb rise due to the FG coupling with the adjacent memory cells after programming verification.

In the reading operation, a reading pass voltage is applied to the non-selected word line. However, when the threshold values of the memory cells Ma and Mb rise due to FG coupling and the memory cells Ma and Mb are not ON because of the reading pass voltage, the NAND strings cannot be read. Moreover, when a ON margin of the memory cells Ma and Mb decreases, problems such as unstable operation may occur. Thus, the influence of the FG coupling between the memory cells results in increase of the threshold value distribution width of the memory cells of data "0" and "1" and impairs the reliability of the flash memory.

SUMMARY OF THE INVENTION

In view of the above, the invention provides a semiconductor memory device that suppresses the influence caused by FG coupling between memory cells to improve reliability.

Solution to the Problem

A semiconductor memory device of the invention includes: a memory array including a plurality of NAND strings; a row selection element selecting a row of the memory array; and a page selection element selecting an even-numbered page or an odd-numbered page of the row selected by the row selection element. The even-numbered page includes a plurality of adjacent bit line pairs and the odd-numbered page includes a plurality of adjacent bit line pairs, and the bit line pairs of the even-numbered page and the bit line pairs of the odd-numbered page are arranged alternately.

An operation method of the invention is for a flash memory, which has a memory array including a plurality of NAND strings. The operation method includes: a step of selecting a row of the memory array; and a page selection step of selecting an even-numbered page or an odd-numbered page of the selected row. The even-numbered page includes a plurality of adjacent bit line pairs and the odd-numbered page includes a plurality of adjacent bit line pairs, and the bit line pairs of the even-numbered page and the bit line pairs of the odd-numbered page are arranged alternately.

Effects of the Invention

According to the invention, the bit line pairs of the even-numbered page and the bit line pairs of the odd-numbered page are arranged alternately, so as to provide a flash memory that suppresses FG coupling between adjacent memory cells and thereby achieves high reliability.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

FIG. 8(A) and FIG. 8(B) are flowcharts showing the programming operation of the flash memory of this embodiment, wherein FIG. 8(A) is a flowchart of the programming of the even-numbered page and FIG. 8(B) is a flowchart of the programming of the odd-numbered page.

FIG. 10(A) and FIG. 10(B) are flowcharts showing the reading operation of the flash memory of this embodiment, wherein FIG. 10(A) is a flowchart of the reading of the even-numbered page and FIG. 10(B) is a flowchart of the reading of the odd-numbered page.

DESCRIPTION OF THE EMBODIMENTS

Hereinafter, embodiments of the invention are described in detail with reference to the figures. It should be noted that, in order to clearly illustrate the components to facilitate comprehension, the components in the figures may not be drawn to scale.

Figure 3:
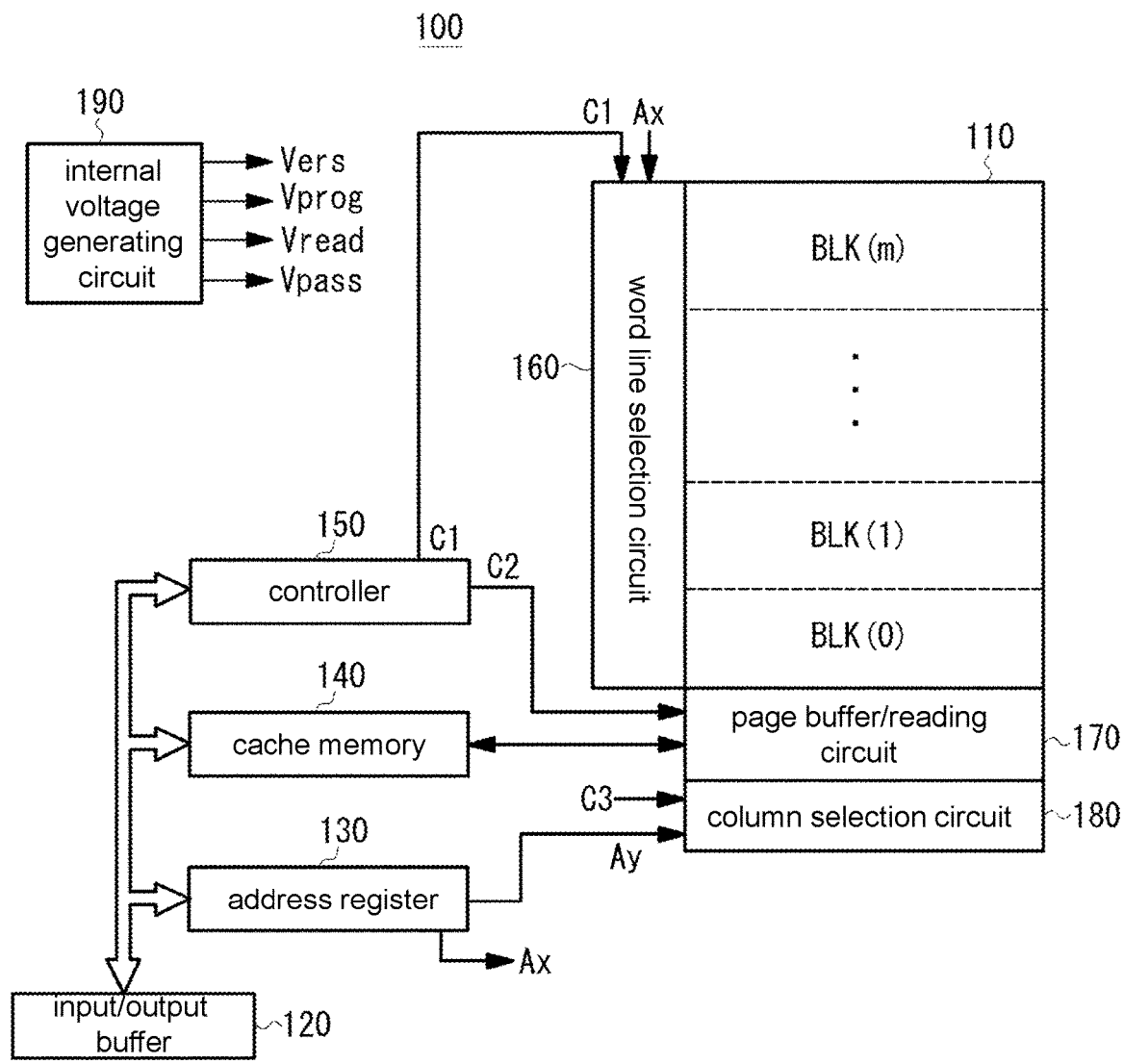
FIG. 3 is a block diagram showing a structural example of the flash memory according to an embodiment of the invention.

FIG. 3 is a block diagram showing a structural example of a NAND flash memory of this embodiment. As shown in FIG. 3, a flash memory 100 includes: a memory array 110 formed with a plurality of memory cells that are arranged as an array; an input/output buffer 120 connected to an external input/output terminal I/O; an address register 130 receiving address data from the input/output buffer 120; a cache memory 140 retaining input/output data; a controller 150 generating control signals C1, C2, and C3, etc., which control each part based on command data from the input/output buffer 120 and an external control signal (chip enable (CE), command latch enable (CLE), address latch enable (ALE), ready/busy (RY/BY), etc., not shown); a word line selection circuit 160 decoding row address information Ax from the address register 130 to perform selection of blocks and selection of word lines based on a decoding result; a page buffer/reading circuit 170 retaining data read via a bit line or retaining programming data via the bit line; a column selection circuit 180 decoding column address information Ay from the address register 130 to perform selection of bit lines based on the decoding result; and an internal voltage generating circuit 190 generating voltages (e.g. a programming voltage Vprog, a pass voltage Vpass, a reading voltage Vread, and an erasing voltage Vers (including an erasing pulse)) required for reading, programming (writing), and erasing data.

The memory array 110 includes a plurality of blocks BLK(0), BLK(1), . . . BLK(m) that are arranged in a column direction. The page buffer/reading circuit 170 is disposed at one end of the block. Nevertheless, the page buffer/reading circuit 170 may also be disposed at the other end or at both ends of the block.

Figure 4:
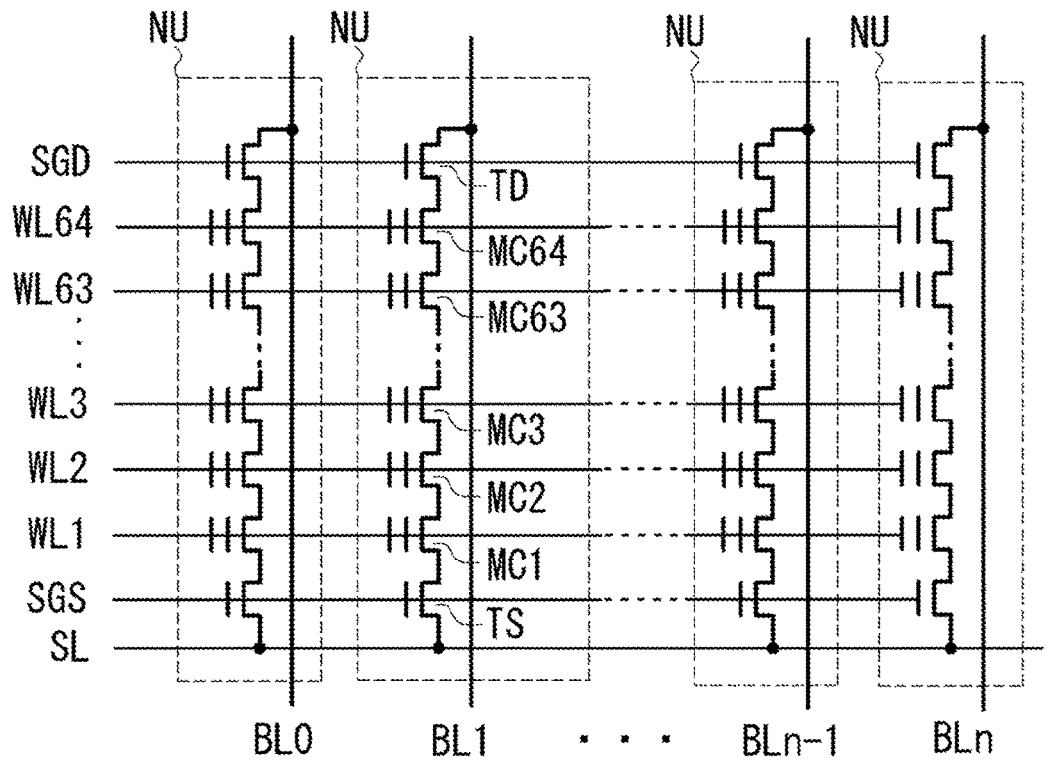
FIG. 4 is a circuit diagram showing a structure of the NAND string of the flash memory according to an embodiment of the invention.

In one block, as shown in FIG. 4, a plurality of NAND string units NU are formed by connecting a plurality of memory cells in series. In the figure, in one block, n+1 string units NU are arranged in a row direction. The string unit NU includes: a plurality of memory cells MCi (i=1, 2, 3, . . . 64) that are connected in series; a bit line selection transistor TD connected to a drain side of the memory cell MC64; and a source line selection transistor TS connected to a source side of the memory cell MC1. A drain of the bit line selection transistor TD is connected to a corresponding bit line BL, and a source of the source line selection transistor TS is connected to a common source line SL.

A control gate of the memory cell MCi is connected with a word line WLi, and gates of the selection transistors TD and TS are connected with selection gate lines SGD and SGS. The word line selection circuit 160 selects the blocks based on the row address information Ax to supply a voltage corresponding to the operation to the selection gate signals SGS and SGD of the selected block.

Typically, the memory cell has a metal oxide semiconductor (MOS) structure, which includes: source/drain serving as an N type diffusion region formed in a P well; a tunnel oxide layer formed on a channel between the source/drain; a floating gate (charge storage layer) formed on the tunnel oxide layer; and a control gate formed on the floating gate with a dielectric layer therebetween. When the floating gate stores no charge, i.e. data "1" is written, the threshold value is in a negative state and the memory cell is normally on. When the floating gate stores charges, i.e. data "0" is written, the threshold value shift is positive and the memory cell is normally off.

Table 1 is a table showing an example of bias voltages that are applied in each operation of the flash memory. In a reading operation, a positive voltage is applied to the bit line; a voltage (e.g. 0V) is applied to the selected word line; a pass voltage Vpass (e.g. 4.5V) is applied to the non-selected word line; a positive voltage (e.g. 4.5V) is applied to the selection gate lines SGD and SGS to turn on the bit line selection transistor TD and the source line selection transistor TS; and the common source line SL is set to 0V. In a programming operation, a high-voltage programming voltage Vprog (15V~20V) is applied to the selected word line; an intermediate potential (e.g. 10V) is applied to the non-selected word line to turn on the bit line side selection transistor TD and turn off the source line side selection transistor TS; and a potential corresponding to data "0" or "1" is supplied to the bit line GBL. In an erasing operation, 0V is applied to the selected word line in the block; a high voltage (e.g. 20V) is applied to the P well; and electrons of the floating gate are extracted to a substrate to use the block as a unit for erasing data.

TABLE 1

|  | Erase | Write | Read |
|---|---|---|---|
| Selected word line | 0 | 15-20 V | 0 |
| Non-selected word line | F | 10 V | 4.5 |
| SGD | F | Vcc | 4.5 |
| SGS | F | 0 | 4.5 |
| SL | F | Vcc | 0 |
| P well | 20 | 0 | 0 |

Figure 5:
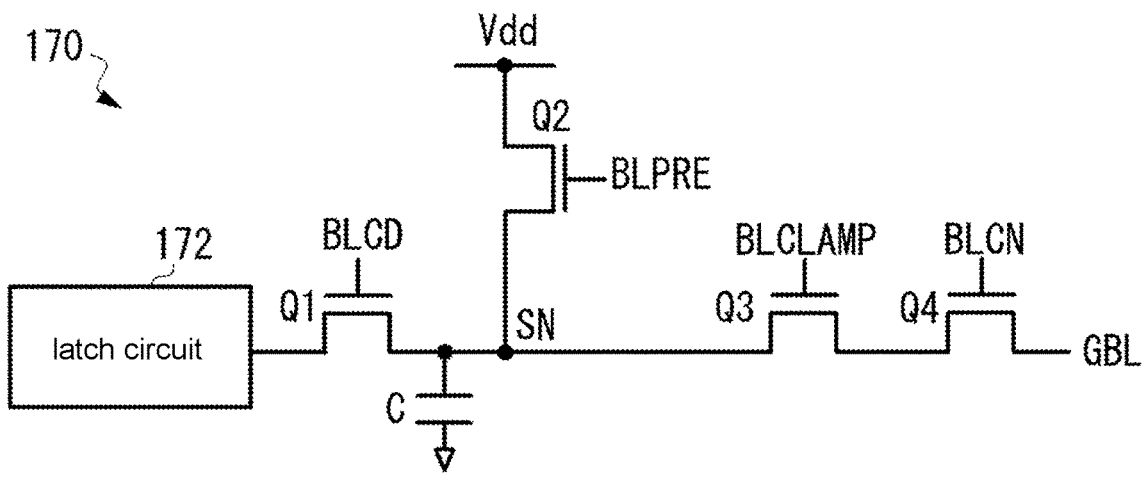
FIG. 5 is a diagram showing an example of the page buffer/reading circuit of the flash memory of this embodiment.

FIG. 5 shows a structural example of the page buffer/reading circuit 170. Here, one page buffer/reading circuit shared by two bit lines, i.e. an even-numbered bit line and an odd-numbered bit line, are illustrated. The page buffer/reading circuit 170 includes a latch circuit 172, which retains data read from the selected memory cell or retains data programmed to the selected memory cell. The latch circuit 172 is connected to a reading circuit via a transmission transistor Q1. The reading circuit includes a transistor Q2 for pre-charging the bit line and transistors Q3 and Q4 for blocking the bit line from the reading circuit. For example, during the reading operation, a gate line BLPRE of the transistor Q2 is driven to a high level and a gate line BLCN of the transistor Q4 is driven to a high level, and then a gate line BLCLAMP of the transistor Q3 is driven to a high level to pre-charge the even-numbered bit line or the odd-numbered bit line. According to the state of the selected memory cell, the potential of the bit line is charged, and a node SN retains the potential of the bit line. Moreover, the gate line BLCD of the transistor Q1 is driven to a high level, and the latch circuit 172 retains "1" or "0" corresponding to the potential of the node SN. For example, during the programming operation, the data retained by the latch circuit 172 is supplied to the bit line via the transistors Q1, Q3, and Q4.

Figure 6:
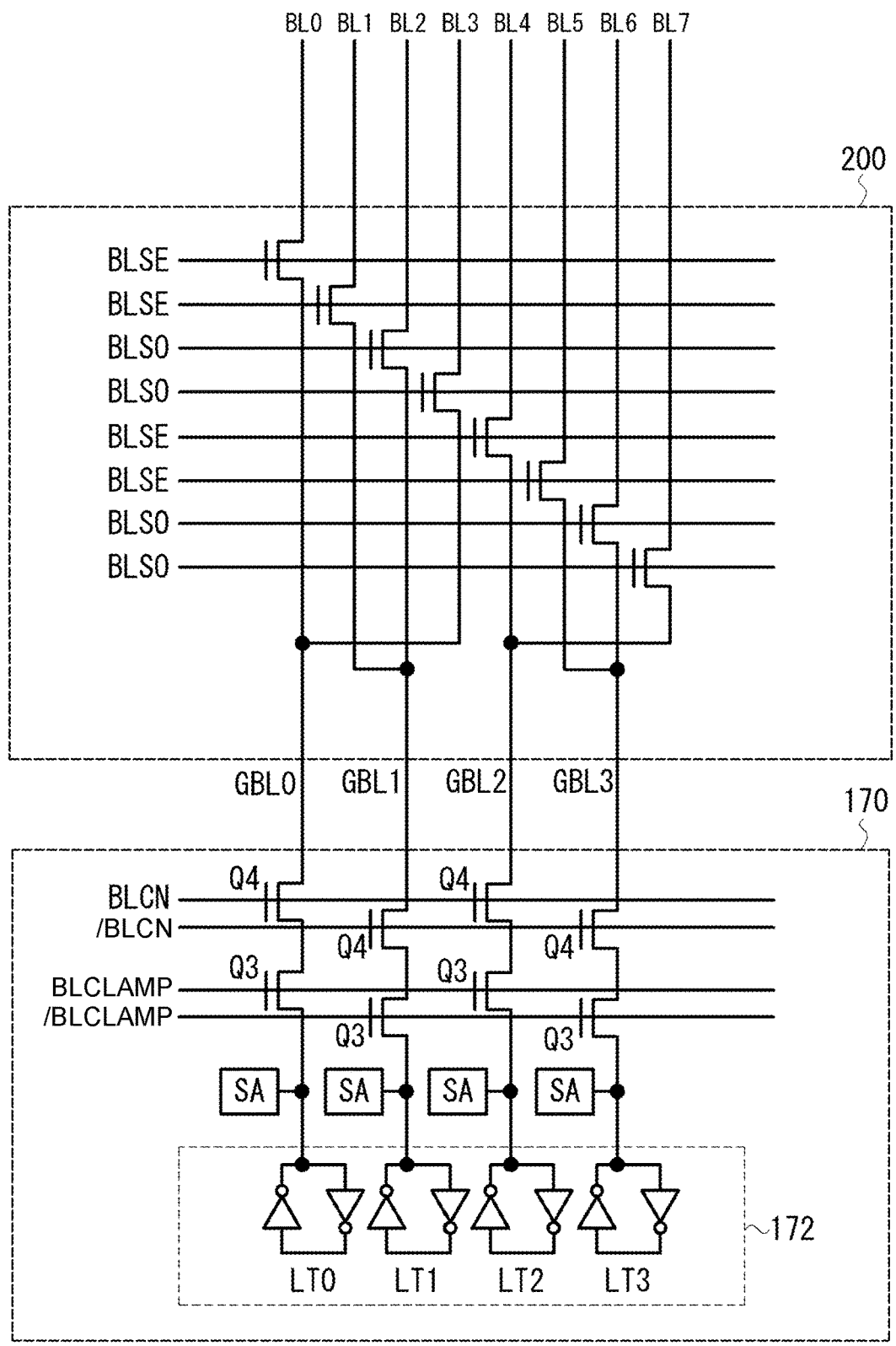
FIG. 6 is a diagram showing the method of selecting the even-numbered page or the odd-numbered page of the flash memory according to an embodiment of the invention.

FIG. 6 is a diagram of a structure of a bit line selection circuit according to this embodiment. A bit line selection circuit 200 may be a part of the page buffer/reading circuit 170 or be connected between the page buffer/reading circuit 170 and the memory array 110. The bit line selection circuit 200 includes a plurality of selection transistors connected with the bit lines BL0, BL1, ... BL7 (here, eight bit lines are illustrated to facilitate the description) in series respectively.

Figure 1:
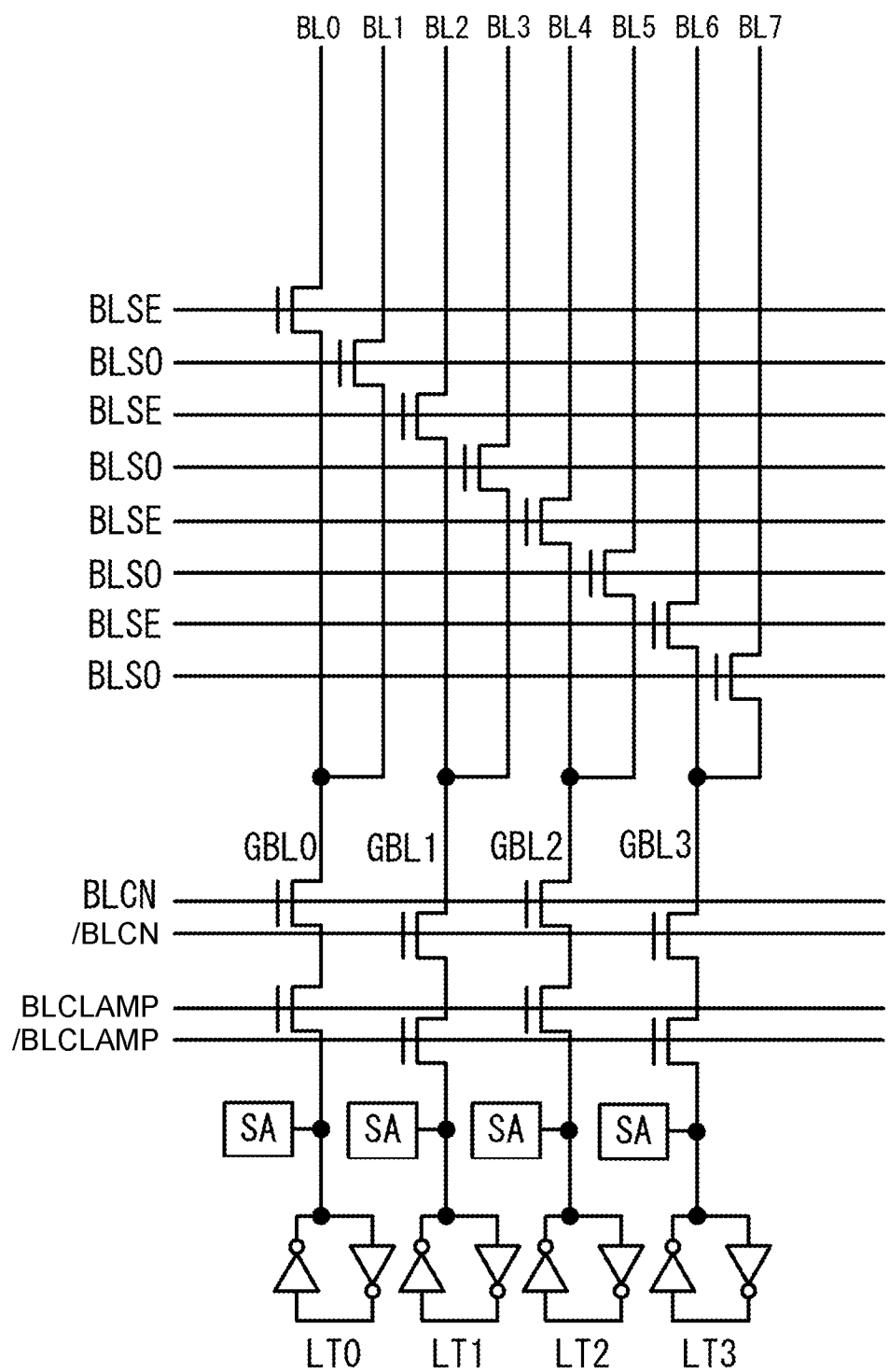
FIG. 1 is a diagram showing the bit line selection method of the conventional flash memory.

It should be noted that, in the conventional structure as shown in FIG. 1, each gate of the selection transistors connected with the even-numbered bit lines (BL0, BL2, BL4, and BL6) is connected with a selection gate line BLSE and each gate of the selection transistors connected with the odd-numbered bit lines (BL1, BL3, BL5, and BL7) is connected with a selection gate line BLSO. However, in this embodiment, each gate of the selection transistors connected with the bit lines BL0, BL1, BL4, and BL5 is connected with the selection gate line BLSE and each gate of the selection transistors connected with the bit lines BL2, BL3, BL6, and BL7 is connected with the selection gate line BLSO. That is, in this embodiment, a plurality of pairs of adjacent bit line pairs constitute an even-numbered page and a plurality of pairs of adjacent bit line pairs constitute an odd-numbered page, and the bit line pairs of the even-numbered page and the bit line pairs of the odd-numbered page are arranged alternately. The bit line selection circuit 200 drives the selection gate line BLSE to a high level and drives the selection gate line BLSO to a low level when selecting the even-numbered page, and drives the selection gate line BLSE to a low level and drives the selection gate line BLSO to a high level when selecting the odd-numbered page. Thus, in the example of FIG. 6, when the even-numbered page is selected, the bit lines BL0, BL1, BL4, and BL5 are selected; and when the odd-numbered page is selected, the bit lines BL2, BL3, BL6, and BL7 are selected.

Thereby, the bit line selection circuit 200 outputs global bit lines GBL0, GBL1, GBL2, and GBL3 shared by the even-numbered page and the odd-numbered page to the page buffer/reading circuit 170. In the example of FIG. 6, the number of the bit lines of the even-numbered page is four and the number of the bit lines of the odd-numbered page is four. Therefore, the number of the global bit lines is four. The four global bit lines GBL0, GBL1, GBL2, and GBL3 are respectively connected with a reading circuit SA and latch circuits LT0, LT1, LT2, and LT3 of the page buffer/reading circuit 170.

It should be noted that, in the conventional structure shown in FIG. 1, the adjacent bit lines are connected with the global bit line (for example, the bit line BL0 and the bit line BL1 are connected with the global bit line GBL0). However, in this embodiment, one bit line of one bit line pair of the even-numbered page and one bit line of one bit line pair of the odd-numbered page adjacent to the aforementioned bit line pair are connected with one global bit line. Specifically, one bit line BL0 of one bit line pair of the even-numbered page and one bit line BL3 of one bit line pair of the odd-numbered page are connected with the global bit line GBL0 while the other bit line BL1 of one bit line pair of the even-numbered page and the other bit line BL2 of one bit line pair of the odd-numbered page are connected with the global bit line GBL1. Such a connection relationship also applies to the other bit line pair of the even-numbered page and the other bit line pair of the odd-numbered page.

The connection relationship between the bit lines and the global bit lines when the even-numbered page is selected and when the odd-numbered page is selected is shown in the following Table 2. That is, the bit line BL0 or the bit line BL3 is connected with the global bit line GBL0, the bit line BL1 or the bit line BL2 is connected with the global bit line GBL1, the bit line BL4 or the bit line BL7 is connected with the global bit line GBL2, and the bit line BL5 or the bit line BL6 is connected with the global bit line GBL3.

TABLE 2

|  | GBL0 | GBL1 | GBL2 | GBL3 |
|---|---|---|---|---|
| selecting even-numbered page | BL0 | BL1 | BL4 | BL5 |
| selecting odd-numbered page | BL3 | BL2 | BL7 | BL6 |

Figure 7:
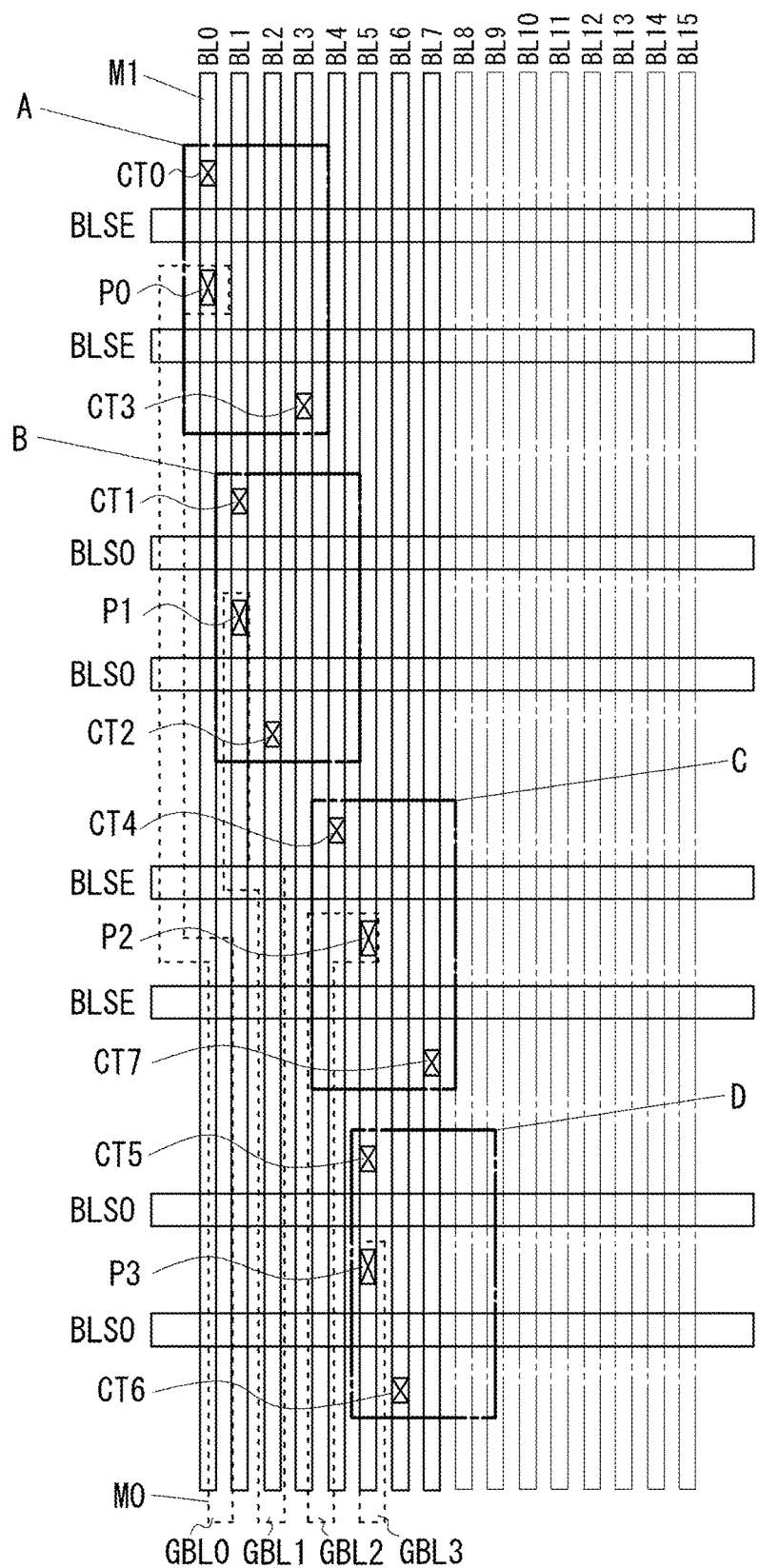
FIG. 7 is a layout diagram showing the connection method of the bit lines and the global bit lines in the bit line selection circuit of this embodiment.

FIG. 7 illustrates an example of a connection layout of the bit lines BL1-BL7 and the global bit lines in the bit line selection circuit. As shown in FIG. 7, the bit lines BL0, BL1, . . . BL15 are arranged at a minimum interval, the same as a pitch between the memory cells. Thus, it is difficult to form other wirings between the bit lines. Therefore, in this embodiment, the connection between the global bit lines and the bit lines is formed by using a diffusion region formed in the well or the substrate, for example. The bit lines BL0, BL1, . . . BL7 include a metal layer M1, for example, and the selection gate lines BLSE and BLSO including a poly silicon layer, for example, are formed in a direction intersecting the bit lines and lower than the bit lines. An N type diffusion region is respectively formed on two sides of the selection gate lines BLSE and BLSO. The N type diffusion region is for forming an even-numbered page selection transistor and an odd-numbered page selection transistor. The even-numbered page selection transistor is for selecting the even-numbered page and the odd-numbered page selection transistor is for selecting the odd-numbered page. In a region A, the bit line BL0 is connected with a drain diffusion region of one even-numbered page selection transistor via a contact CT0, and the bit line BL3 is connected with a drain diffusion region of another even-numbered page selection transistor via a contact CT3. In a source diffusion region shared by two even-numbered page selection transistors, the global bit line GBL0 is connected via a contact P0. The global bit line GBL0 includes a metal layer M0 that is below the metal layer M1 constituting the bit lines. Likewise, in other regions B, C, and D, the bit lines are connected with the drain diffusion regions of the transistors via contacts CT4, CT7, CT1, CT2, CT5, and CT6, and the global bit lines GBL1, GBL2, and GBL3 are connected with the common source diffusion region via contacts P1, P2, and P3.

Next, the programming operation of the flash memory of this embodiment is described below. In this embodiment, in order to accurately or effectively perform electron injection on the memory cells, the method of an incremental step pulse program (ISPP) is used. In the method, an initial programming pulse is applied. When it is determined to be ineligible by programming verification, a programming pulse that is higher than the initial programming pulse only by one-step voltage is applied, so as to increase the voltage of the programming pulse sequentially until the programming of all memory cells in the page is determined as eligible.

Figure 8A:
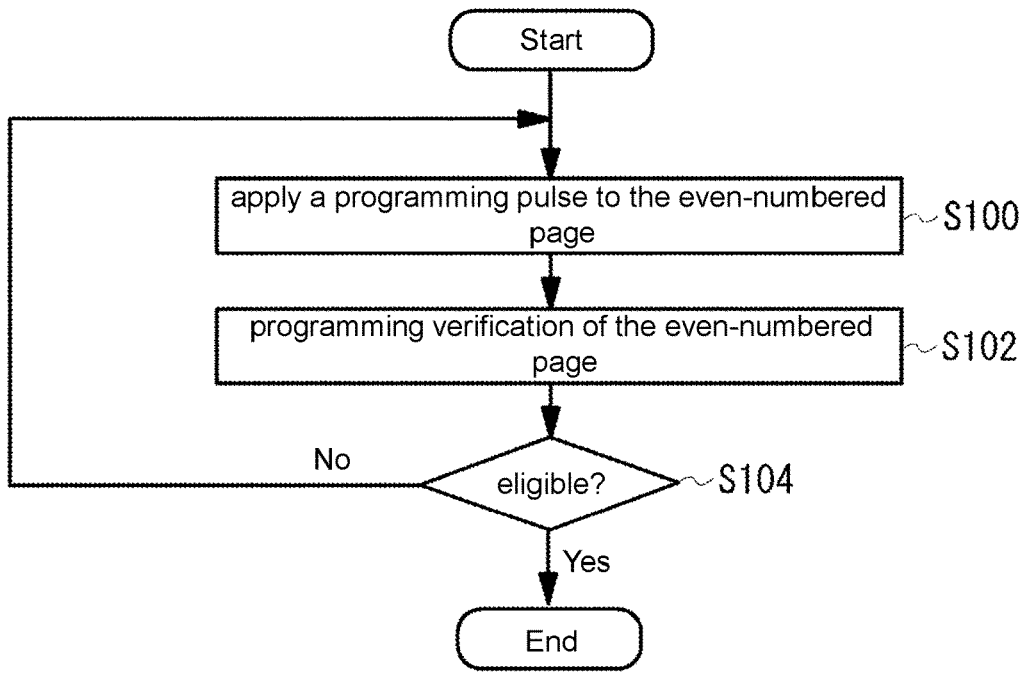
Figure 8B:
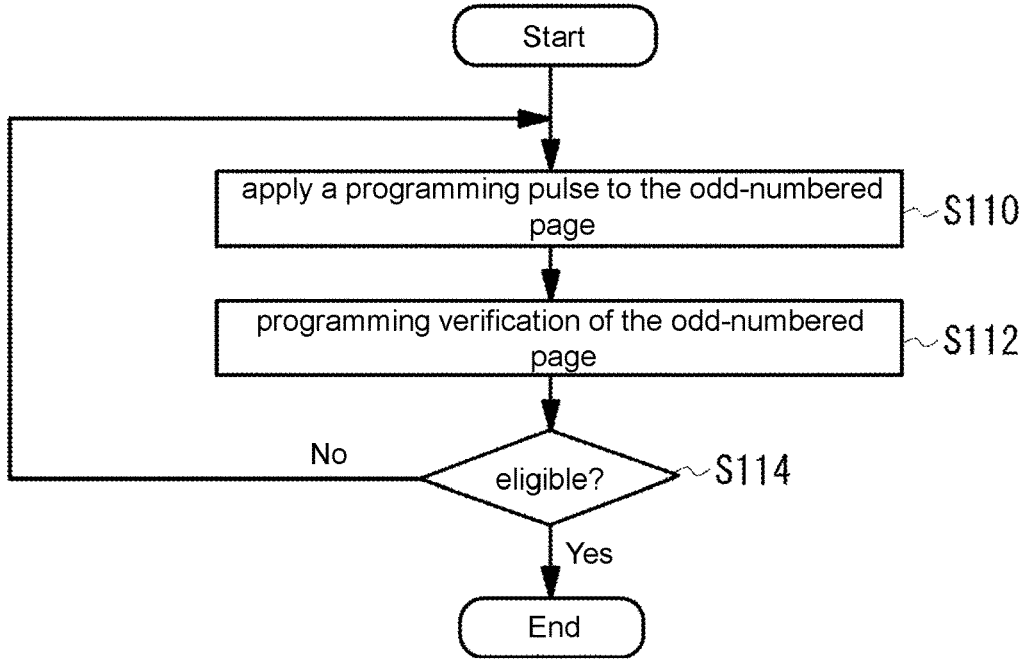

FIG. 8(A) is a flowchart of the programming operation of the even-numbered page and FIG. 8(B) is a flowchart of the programming operation of the odd-numbered page. When the controller 150 receives a program command of the even-numbered page via the input/output buffer 120, a program sequence of the even-numbered page starts. The word line selection circuit 160 selects the blocks of the memory array 110 based on the row address information Ax and selects the word line of the selected block. In addition, the column selection circuit 180 loads program data of the even-numbered page to the page buffer/reading circuit 170 based on the column address information Ay. Moreover, the bit line selection circuit 200 drives the selection gate line BSLE to a high level and drives the selection gate line BLSO to a low level to turn on the even-numbered page selection transistor and turn off the odd-numbered page selection transistor. The bit line of the selected even-numbered page is supplied with a voltage corresponding to the data retained by the latch circuit 172. In this way, the programming pulse is applied to the selected word line, so as to perform programming of the even-numbered page (S100).

Then, verification of the even-numbered page is performed (S102). If an ineligible memory cell exists, a programming pulse is further applied (S104) to supply a voltage of disabling programming to the bit lines of the eligible memory cells. If all the memory cells of the even-numbered page are eligible, programming of the odd-numbered page is performed then.

When the controller 150 receives a program command of the odd-numbered page, a program sequence of the odd-numbered page starts. Since the word line is the same as that when the even-numbered page is programmed, the same word line is selected. The column selection circuit 180 loads program data of the odd-numbered page to the page buffer/reading circuit 170 based on the column address information Ay. The bit line selection circuit 200 drives the selection gate line BSLE to a low level and drives the selection gate line BLSO to a high level to turn off the even-numbered page selection transistor and turn on the odd-numbered page selection transistor. The bit line of the selected odd-numbered page is supplied with a voltage corresponding to the data retained by the latch circuit 172. In this way, the programming pulse is applied to the selected word line, so as to perform programming of the odd-numbered page (S110).

Next, verification of the odd-numbered page is performed (S112). If an ineligible memory cell exists, a programming pulse is further applied (S114) to supply a voltage of disabling programming to the bit lines of the eligible memory cells. If all the memory cells of the odd-numbered page are eligible, the programming ends.

Figure 9A:
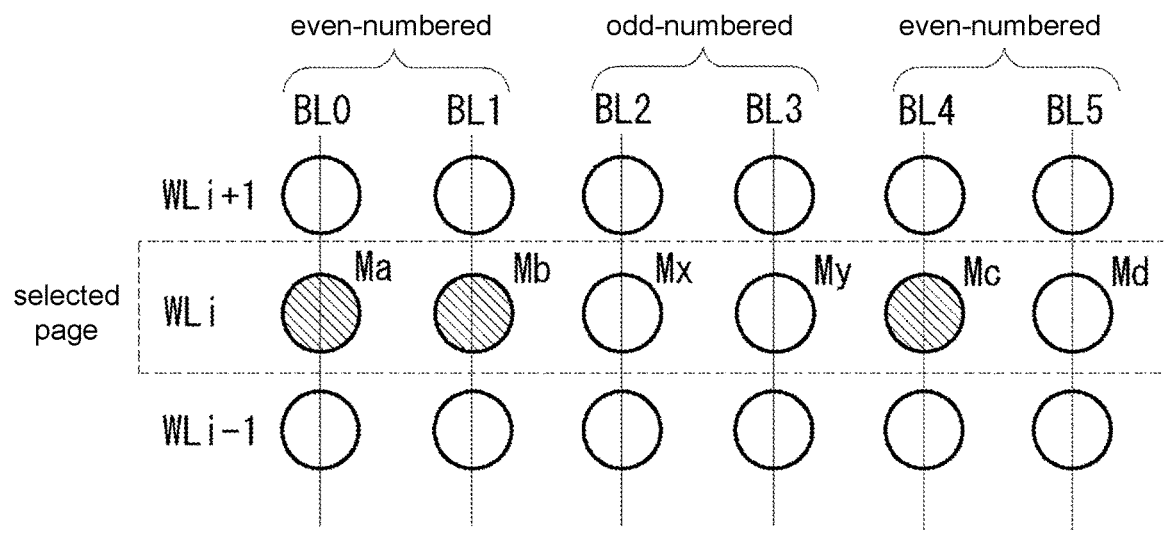
FIG. 9(A) and FIG. 9(B) are diagrams showing the FG coupling between the memory cells during the programming of this embodiment.

Hereinafter, the FG coupling during the programming of this embodiment is described. FIG. 9(A) is an example of programming data "0" to memory cells Ma, Mb, and Mc of the even-numbered page and FIG. 9(B) is an example of programming data "0" to memory cells Mx and My of the odd-numbered page.

When the even-numbered page is programmed, the adjacent memory cells Ma and Mb are applied with a programming pulse simultaneously. When a difference exists between the numbers of times of the programming pulses for the memory cells Ma and Mb, a FG coupling corresponding to the pulse number difference is generated. Specifically, if the numbers of times of applying the programming pulses to the memory cells Ma and Mb are the same, in fact, no FG coupling is generated between the memory cell Ma and the memory cell Mb. On the other hand, if the memory cell Ma is easy to program (for example, the memory cell Ma is verified as eligible after two programming pulses) while the memory cell Mb is difficult to program (for example, the memory cell Mb is verified as eligible after five programming pulses), FG coupling corresponding to the difference between the numbers of times of the programming pulses ($3 \times \Delta Vpgm$: $\Delta Vpgm$ is a step voltage of the programming pulse) may be generated.

Figure 2A:
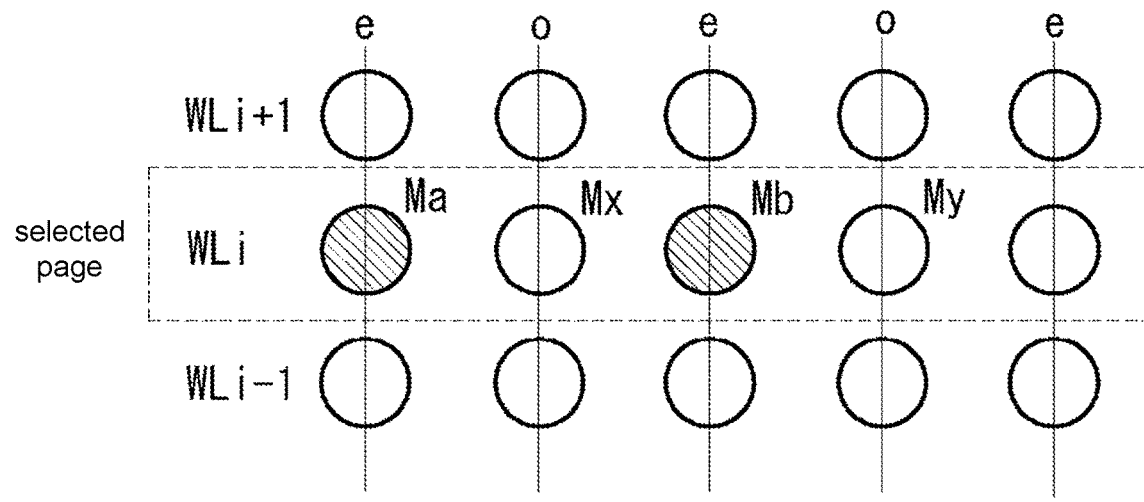
FIG. 2(A) and FIG. 2(B) are diagrams showing the issue of FG coupling between the conventional memory cells.
Figure 2B:
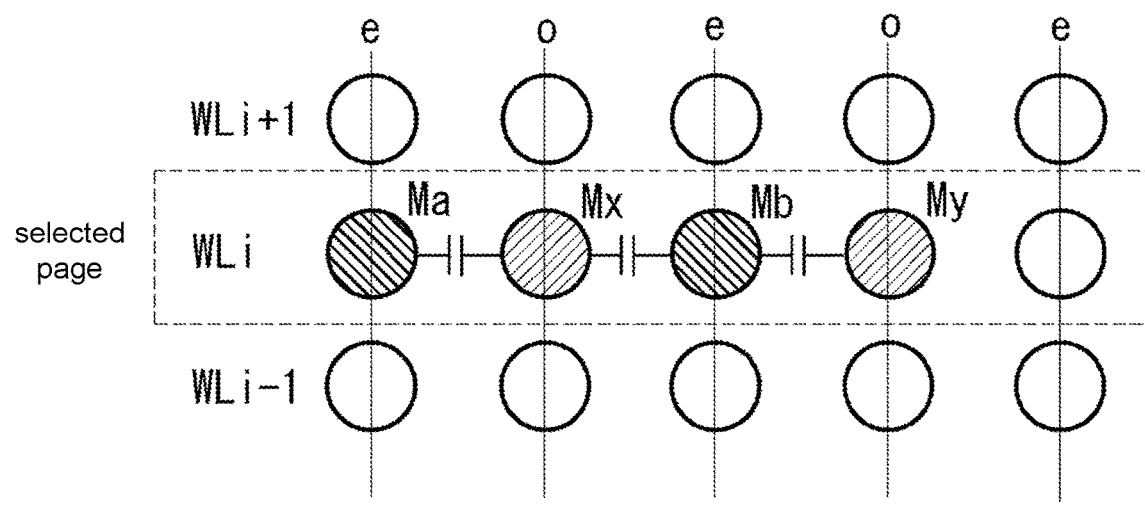

When the even-numbered page is programmed, a threshold value of the memory cell Mx of the odd-numbered page slightly rises due to the FG coupling with the memory cell Mb and a threshold value of the memory cell My slightly rises due to the FG coupling with the memory cell Mc. Here, it should be noted that each of the memory cells Mx and My is adjacent to the memory cell of the even-numbered page only on one side. Thus, the influence of FG coupling is little. In contrast thereto, in the conventional structure shown in FIG. 2(A) and FIG. 2(B), the memory cells of the even-numbered page are adjacent to two sides of the memory cell My. The memory cell My and the two memory cells Ma and Mb form FG coupling. Consequently, the FG coupling causes the rise of the threshold value to increase in comparison with this embodiment. In a case where the memory cell Mx retains data "1" when the odd-numbered page is programmed, the structure of this embodiment suppresses the upper limit of the threshold value distribution width of the data "1" from becoming wider better than the conventional structure.

Figure 9B:
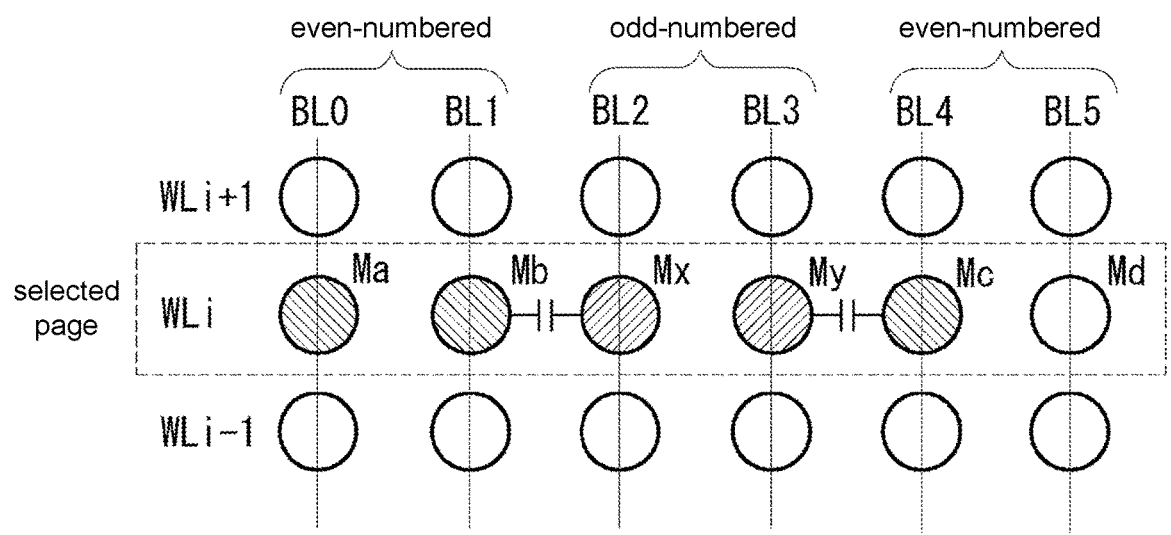

Next, as shown in FIG. 9(B), when the memory cells Mx and My of the odd-numbered page are programmed with the data "0", a threshold value of the memory cell Mb rises due to the FG coupling with the memory cell Mx and a threshold value of the memory cell Mc rises due to the FG coupling with the memory cell My. Here, it should be noted that the memory cell Mx of the odd-numbered page forms FG coupling only with the memory cell Mb of the even-numbered page, and the memory cell My forms FG coupling only with the memory cell Mc. Therefore, a threshold value Vth_b of the memory cell Mb is Vth_b+$\Delta V$ ($\Delta V$ is the voltage that rises due to the FG coupling with one memory cell), and a threshold value Vth_c of the memory cell Mc is Vth_c+$\Delta V$. On the other hand, in the conventional structure shown in FIG. 2(A) and FIG. 2(B), the threshold value Vth_b of the memory cell Mb is Vth_b+$2\Delta V$ since it forms FG coupling with two adjacent memory cells Mx and My of the odd-numbered page. The rise of the threshold value increases in comparison with this embodiment. In addition, the memory cells Mx and My of the odd-numbered page are applied with the programming pulse simultaneously. Therefore, the FG coupling between the memory cells Mx and My is merely the difference between the numbers of times of the programming pulses.

Hereinafter, the reading operation of the flash memory of this embodiment is described. Like this embodiment, the bit line pairs of the even-numbered page and the bit line pairs of the odd-numbered page are arranged alternately. As a result, when the even-numbered page or the odd-numbered page is read, the adjacent bit lines are read simultaneously. For example, when the even-numbered page is read, the bit lines BL0 and BL1 are adjacent, and the bit lines BL4 and BL5 are adjacent; and when the odd-numbered page is read, the bit lines BL2 and BL3 are adjacent, and the bit lines BL6 and BL7 are adjacent. In the case where the reading circuit is voltage detection type, the potential of the bit line that has been discharged is detected. Thus, if the potential of one bit line remains unchanged while the other bit line is discharged, because of the capacity coupling between the bit lines, the potential of the other bit line becomes difficult to discharge. As a result, the potential of the bit line may not be detected quickly and accurately via the reading circuit.

Figure 10A:
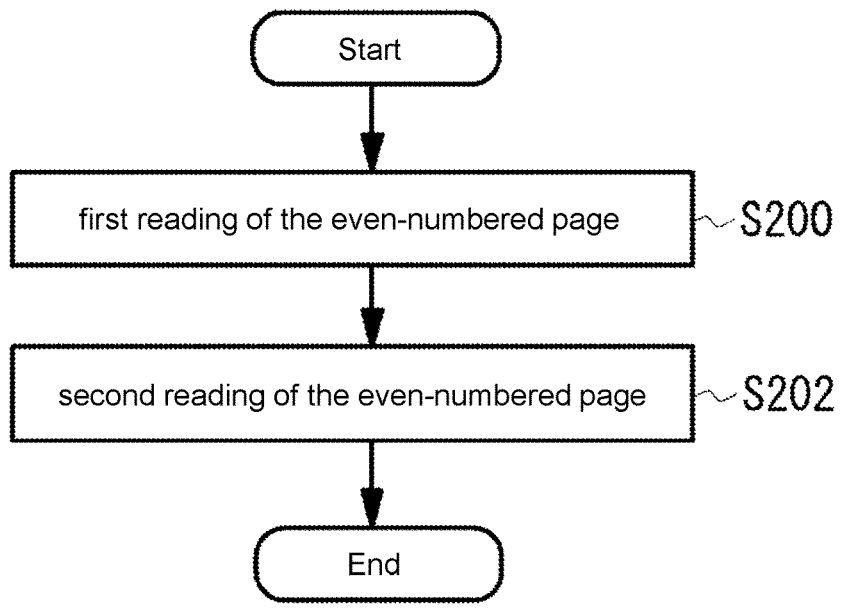

Hence, in this embodiment, reading of the even-numbered page and the odd-numbered page are carried out respectively in two stages. First, as shown in FIG. 10(A), when a read command of the even-numbered page is received, during a first reading of the even-numbered page, one bit line of one bit line pair of the even-numbered page is read while the other bit line is connected with a ground (S200). For example, when the bit lines BL0 and BL4 are read, the bit lines BL1 and BL5 are set to a ground potential. Accordingly, shield reading of the bit lines BL0 and BL4 becomes possible. Moreover, the bit lines BL1 and BL5 may be connected with GND via a bit line discharge transistor (not shown) in FIG. 6, or be connected with the ground by setting a Vdd power source, which supplies power to a pre-charge transistor of the reading circuit, to 0V.

Next, a second reading of the even-numbered page is performed (S202). One bit line of one bit line pair is connected with the ground while the other bit line is read. That is, opposite to the first reading, the bit lines BL1 and BL5 are read while the bit lines BL0 and BL4 are set to the ground potential.

Figure 10B:
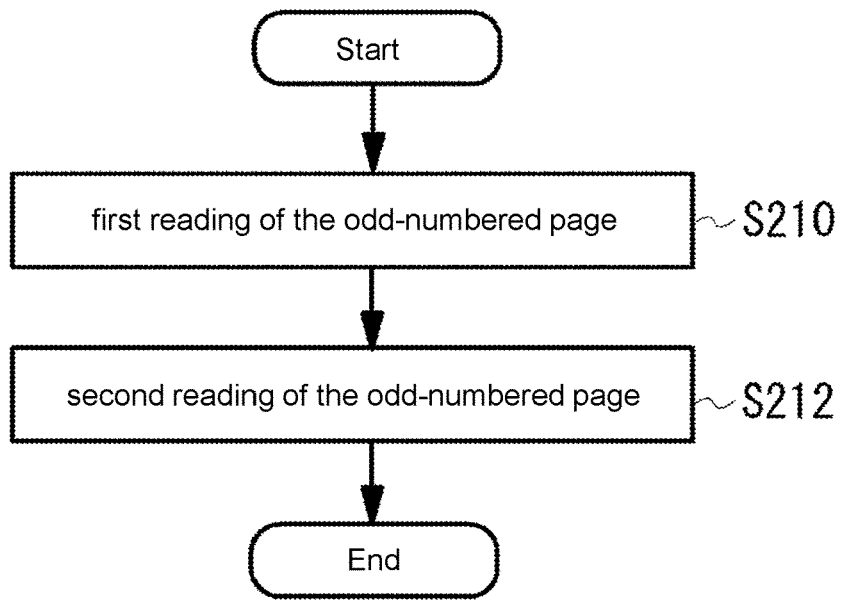

When the reading of the even-numbered page ends, the odd-numbered page is read in response to a read command of the odd-numbered page. Likewise, as shown in FIG. 10(B), during the first reading, one bit line of one bit line pair is read while the other bit line is connected with the ground; and during the second reading, one bit line of one bit line pair is connected with the ground while the other bit line is read, so as to perform shield reading (S210 and S212).

In addition, in the case where the reading circuit is current detection type, since the potential of the bit line is not detected, shield reading is not required. At this time, reading can be performed on the even-numbered page and the odd-numbered page one time respectively.

Figure 11:
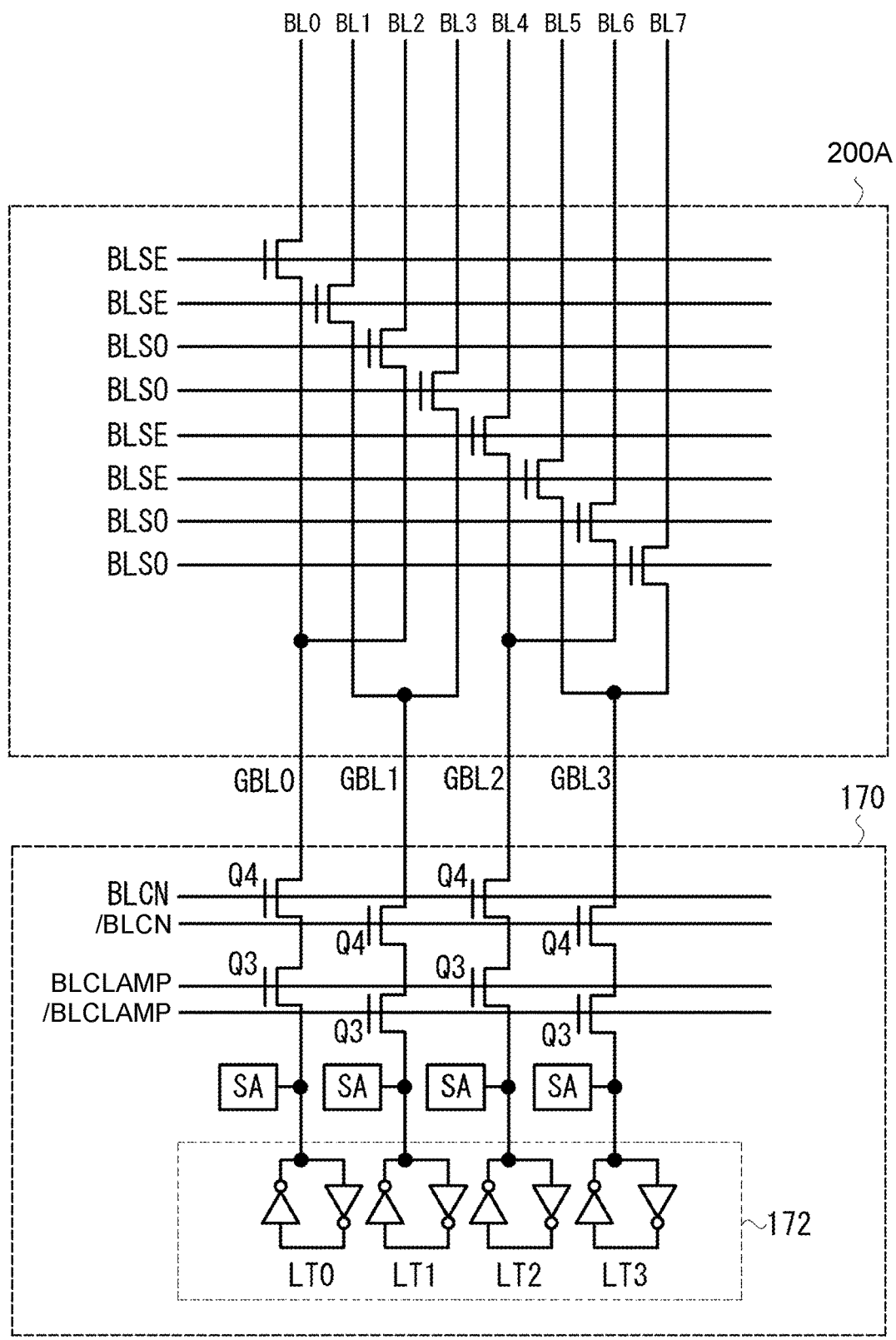
FIG. 11 is a diagram showing a modified example of the bit line selection circuit of this embodiment.

Next, a modified example of the bit line selection circuit of this embodiment is shown in FIG. 11. A bit line selection circuit 200A as shown in FIG. 11 is the same as the bit line selection circuit of FIG. 6, except that the combination of the bit lines connected with the global bit lines is changed. As shown in the following Table 3, the bit line BL0 or the bit line BL2 is connected with the global bit line GBL0, the bit line BL1 or the bit line BL3 is connected with the global bit line GBL1, the bit line BL4 or the bit line BL6 is connected with the global bit line GBL2, and the bit line BL5 or the bit line BL6 is connected with the global bit line GBL3.

TABLE 3

|  | GBL0 | GBL1 | GBL2 | GBL3 |
|---|---|---|---|---|
| selecting even-numbered page | BL0 | BL1 | BL4 | BL5 |
| selecting odd-numbered page | BL2 | BL3 | BL6 | BL7 |

According to this embodiment, one pair of bit lines that constitutes the even-numbered page and one pair of bit lines that constitutes the odd-numbered page are arranged alternately, so as to suppress the influence of FG coupling. Consequently, the threshold value distribution width of the data "0" and "1" is narrowed to improve the reliability of the flash memory.

Figure 12:
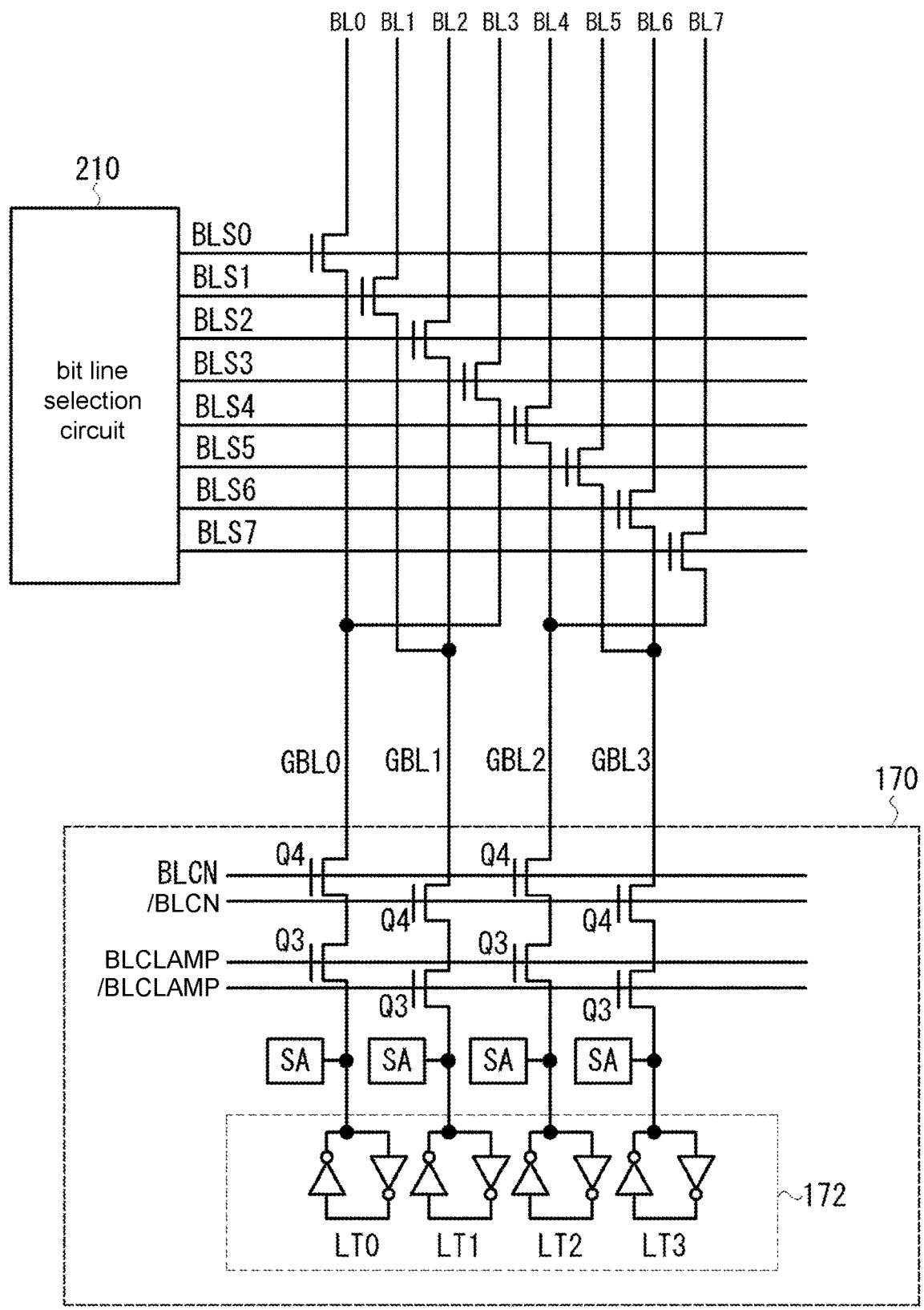
FIG. 12 is a diagram showing switching between the bit line selection methods of the flash memory according to the second embodiment of the invention.

Next, the second embodiment of the invention is described below. A flash memory of the second embodiment is capable of switching between the conventional bit line selection method (default) shown in FIG. 1 and the bit line selection method of this embodiment shown in FIG. 6. FIG. 12 illustrates that, in the bit line selection method of FIG. 6, the bit line selection circuit 210 switches the driving of the selection gate lines BLS0, BLS1, BLS2, . . . BLS7, wherein the selection gate lines BLS0, BLS1, BLS2, . . . BLS7 are for selecting the bit line selection transistor connected with the bit lines BL0, BL1, BL2, . . . BL7.

As shown in the following Table 4, the bit line selection circuit 210 switches the selection gate lines to be driven when the even-numbered page is selected or when the odd-numbered page is selected by selection of default (the bit line selection method of FIG. 1) or option (the bit line selection method of FIG. 6). The selection method of the default or the option is for example implemented by a command from an external controller or a program of a fuse read only memory, for example, before product shipment.

TABLE 4

| BLSi | default | option |
| --- | --- | --- |
| BLS0 | BLSE | BLSE |
| BLS1 | BLSO | BLSE |
| BLS2 | BLSE | BLSO |
| BLS3 | BLSO | BLSO |
| BLS4 | BLSE | BLSE |
| BLS5 | BLSO | BLSE |
| BLS6 | BLSE | BLSO |
| BLS7 | BLSO | BLSO |

In the case of selecting the default, the bit line selection circuit 210 enables the selection gate lines BLS0, BLS2, BLS4, and BLS6 when the even-numbered page is selected, and enables the selection gate lines BLS1, BLS3, BLS5, and BLS7 when the odd-numbered page is selected. This is the bit line selection method shown in FIG. 1. At this time, shield reading may be performed.

In the case of selecting the option, the bit line selection circuit 210 enables the selection gate lines BLS0, BLS1, BLS4, and BL5 when the even-numbered page is selected, and enables the selection gate lines BLS2, BLS3, BLS6, and BL7 when the odd-numbered page is selected. This is the bit line selection method of this embodiment as shown in FIG. 6.

Thus, according to the second embodiment, the bit line selection method of the default or the option may be selected as desired. For example, the default may be selected to avoid two times of the reading method, as in this embodiment. Or, the option may be selected if suppression of the FG coupling between adjacent memory cells has priority.

The aforementioned embodiment illustrates an example that the memory cells store 1 bit of data. However, the memory cells may store multiple bits of data. Moreover, the aforementioned embodiment illustrates an example that the NAND strings are formed on the substrate surface. Nevertheless, the NAND strings may also be three-dimensionally formed on the substrate surface.

Exemplary embodiments of the invention have been disclosed above. Nevertheless, it should be understood that the invention is not limited to any of the above exemplary embodiments, and various modifications or alterations can be made to the disclosed embodiments without departing from the scope or spirit of the invention. In view of the foregoing, it is intended that the invention covers modifications and variations of this disclosure provided that they fall within the scope of the following claims and their equivalents.

What is claimed is:

1. An operation method of a semiconductor memory device that comprises a memory array comprising a plurality of NAND strings, the operation method comprising:
    a step of selecting a row of the memory array;
    a page selection step of selecting an even-numbered page or an odd-numbered page of the selected row, wherein the even-numbered page comprises a plurality of adjacent bit line pairs and the odd-numbered page comprises a plurality of adjacent bit line pairs, and the bit line pairs of the even-numbered page and the bit line pairs of the odd-numbered page are arranged alternately; and
    a bit line selection step of selecting bit lines to be adjacent bit line pairs of the even-numbered page and selecting bit lines to be adjacent bit line pairs of the odd-numbered page,
    wherein in a first operation mode, a bit line of the adjacent bit line pair of the even-numbered page is immediately next a bit line of the adjacent bit line pair of the odd-numbered page, and the other bit line of the adjacent bit line pair of the even-numbered page is immediately next to the other bit line of the adjacent bit line pair of the odd-numbered page,
    wherein in a second operation mode, a bit line of the adjacent bit line pair of the even-numbered page is immediately next to the other bit line of the adjacent bit line pair of the even-numbered page, and a bit line of the adjacent bit line pair of the odd-numbered page is immediately next to the other bit line of the adjacent bit line pair of the odd-numbered page,
    wherein the bit line of the adjacent bit line pair of the even-numbered page and the bit line of the adjacent bit line pair of the odd-numbered page are both electrically connected with a first global bit line, and the other bit line of the adjacent bit line pair of the even-numbered page and the other bit line of the adjacent bit line pair of the odd-numbered page are both electrically connected with a second global bit line.

2. The operation method according to claim 1, wherein: the operation method further comprises the following step: connecting the even-numbered page with a page buffer/reading circuit when the even-numbered page is selected; and connecting the odd-numbered page with the page buffer/reading circuit shared with the even-numbered page when the odd-numbered page is selected.

3. The operation method according to claim 1, wherein: the operation method further comprises a step of programming a memory cell of the selected row, and the programming step comprises programming a memory cell of the even-numbered page selected in the page selection step, and then programming a memory cell of the odd-numbered page selected in the page selection step.

4. The operation method according to claim 1, wherein: the operation method further comprises a step of reading the memory cell of the selected row, and the reading step comprises performing reading of a memory cell of a bit line of the bit line pair of the even-numbered page when the even-numbered page is read, during which the other bit line of the bit line pair of the even-numbered page is set to a ground potential, and then performing reading of a memory cell of the other bit line of the bit line pair of the even-numbered page, during which the bit line of the bit line pair of the even-numbered page is set to the ground potential, and performing reading of a memory cell of a bit line of the bit line pair of the odd-numbered page when the odd-numbered page is read, during which the other bit line of the bit line pair of the odd-numbered page is set to the ground potential, and then performing reading of a memory cell of the other bit line of the bit line pair of the odd-numbered page, during which the bit line of the bit line pair of the odd-numbered page is set to the ground potential.

5. The operation method according to claim 1, wherein:
the operation method further comprises a step of switching selection of the page selection step, and
when the selection of the page selection step is switched, the even-numbered page comprises an even-numbered bit line and the odd-numbered page comprises an odd-numbered bit line, and the even-numbered bit line and the odd-numbered bit line are arranged alternately.

6. The operation method according to claim 1, wherein the page selection comprises:
selecting the bit line pairs of the even-numbered page by an even-numbered page selection transistor;
selecting the bit line pairs of the odd-numbered page by an odd-numbered page selection transistor.

7. The operation method according to claim 1, further comprising:
connecting the bit line of the adjacent bit line pair of the even-numbered page with a first diffusion region of an even-numbered page selection transistor, connecting the bit line of the adjacent bit line pair of the odd-numbered page with a first diffusion region of an odd-numbered page selection transistor, and connecting a second diffusion region shared by the even-numbered page selection transistor and the odd-numbered page selection transistor with the first global bit line.

8. The operation method according to claim 5, wherein the step of switching selection of the page selection step comprises:
receiving a command from outside;
controlling the switch element by the received command.

* * * * *